United States Patent [19]
Watakabe et al.

[11] Patent Number: 5,322,748
[45] Date of Patent: Jun. 21, 1994

[54] PHOTOMASK AND A METHOD OF MANUFACTURING THEREOF COMPRISING TRAPEZOIDAL SHAPED LIGHT BLOCKERS COVERED BY A TRANSPARENT LAYER

[75] Inventors: Yaichiro Watakabe; Shuichi Matsuda, both of Hyogo, Japan

[73] Assignee: Mitsubishi Denki Kabushiki Kaisha, Tokyo, Japan

[21] Appl. No.: 932,187

[22] Filed: Aug. 21, 1992

[30] Foreign Application Priority Data

Sep. 5, 1991 [JP] Japan ................... 3-225783
Jun. 24, 1992 [JP] Japan ................... 4-165903

[51] Int. Cl.$^5$ ............................... G03F 9/00
[52] U.S. Cl. ........................ 430/5; 430/322; 430/324; 430/396; 156/643
[58] Field of Search ............ 430/5, 22, 269, 322, 430/324, 323, 396; 156/643

[56] References Cited

U.S. PATENT DOCUMENTS

| 5,045,417 | 9/1991 | Okamoto | 430/5 |
| 5,127,989 | 7/1992 | Haraguchi et al. | 430/313 |

FOREIGN PATENT DOCUMENTS

| 57-62052 | 4/1982 | Japan . |
| 58-173744 | 10/1983 | Japan . |
| 2-211451 | 8/1990 | Japan . |
| 3-119355 | 5/1991 | Japan . |
| 3144453 | 6/1991 | Japan . |
| 3-191347 | 8/1991 | Japan . |
| 3-209474 | 9/1991 | Japan . |
| 3-211554 | 9/1991 | Japan . |
| 4-3412 | 1/1992 | Japan . |
| 4-6557 | 1/1992 | Japan . |
| 4-40455 | 2/1992 | Japan . |

Primary Examiner—Steve Rosasco
Attorney, Agent, or Firm—Lowe, Price, LeBlanc & Becker

[57] ABSTRACT

A photomask includes a transparent substrate, a light shielding film formed on the substrate, and a transparent film formed on the light shielding film and the substrate. The light shielding film has a bottom in contact with the substrate, a side face at an acute angle to the bottom, and an upper face in parallel with the bottom and at an obtuse angle to the side face. According to the light shielding film having such a configuration, a phase shift portion of a predetermined width and thickness can be formed accurately in the periphery of the light shielding film. The inferior influence of reflecting light with respect to the pattern resolution can be reduced if films of low reflectance are provided in the upper and lower portions of the light shielding film to improve the pattern resolution. The method of manufacturing this photomask includes the steps of patterning the light shielding film having a trapezoid configuration in which the upper base is shorter than the lower base on a transparent substrate, and forming a transparent film at a temperature of not more than 250° C. on the substrate and the light shielding film. The thermal distortion in the light shielding film can be suppressed effectively by the formation of a transparent film.

19 Claims, 13 Drawing Sheets

RESISTIVITY VS. IMPURITY CONCENTRATION
FOR Ge, Si, AND GaAs at 300°K

WAVELENGTH OF THE TRANSMITTING LIGHT

WAVELENGTH DEPENDENCY OF LIGHT TRANSMITTANCE

FIG. 16(a) PRIOR ART
FIG. 16(b) PRIOR ART
AMPLITUDE OF LIGHT RIGHT AFTER
PASSING THE PHOTOMASK
FIG. 16(c) PRIOR ART
AMPLITUDE OF LIGHT IN THE
PROXIMITY OF THE WAFER
FIG. 16(d) PRIOR ART
LIGHT INTENSITY ON THE WAFER
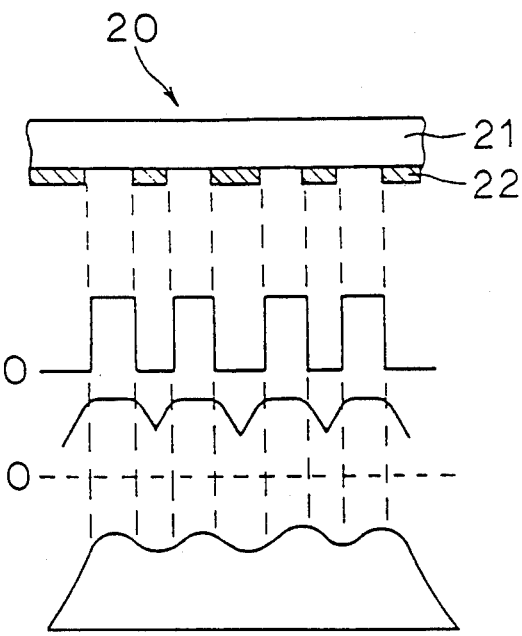
FIG. 16(e) PRIOR ART
RESIST AFTER BEING PATTERNED
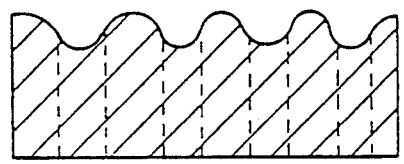

FIG. 17(a) PRIOR ART
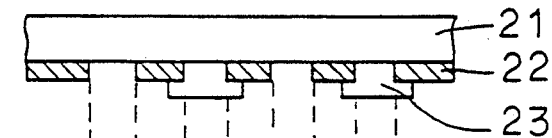
FIG. 17(b) PRIOR ART
AMPLITUDE OF LIGHT RIGHT AFTER
PASSING THE PHOTOMASK
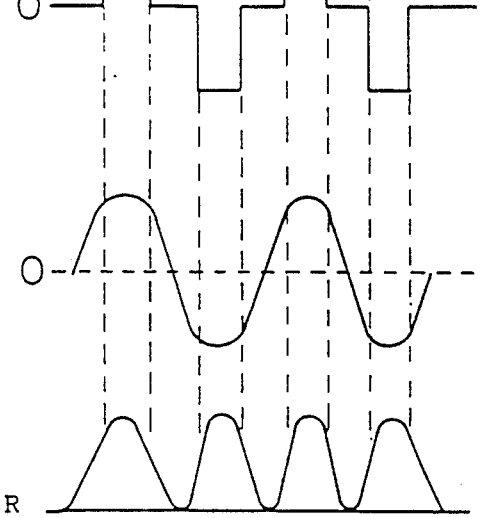
FIG. 17(c) PRIOR ART
AMPLITUDE OF LIGHT IN THE
PROXIMITY OF THE WAFER
FIG. 17(d) PRIOR ART
LIGHT INTENSITY ON THE WAFER
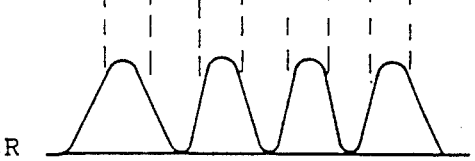
FIG. 17(e) PRIOR ART
RESIST AFTER BEING PATTERNED
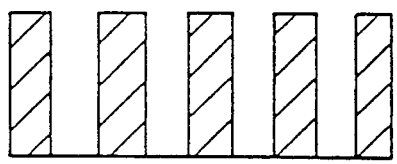

LIGHT INTENSITY ON THE WAFER

PHOTOMASK AND A METHOD OF MANUFACTURING THEREOF COMPRISING TRAPEZOIDAL SHAPED LIGHT BLOCKERS COVERED BY A TRANSPARENT LAYER

BACKGROUND OF THE INVENTION

1. Field of the Invention

The present invention relates to a photomask and a method of manufacturing thereof, and more particularly, to a photomask of high pattern resolution that can have a phase shift portion formed easily and with precision, and a method of manufacturing thereof.

2. Description of the Background Art

The remarkable advance in larger scale integration and miniaturization in semiconductor integrated circuits has also called for a drastic progress of miniaturization in circuit patterns formed on a semiconductor substrate (referred to as "wafer" hereinafter). The photolithography technique is particularly widely recognized as the basic technique in pattern formation. Various developments and improvements have been carried out regarding the photolithography technology. However, there is still a great pressure to scale the patterns to a higher density with the need of improvement in resolution.

The resolution R (nm) in photolithography using the reduction exposure method is typically expressed as $R = K_1 \cdot \lambda / (NA)$, where $\lambda$ is the wavelength of the employed light (nm), NA is the numerical aperture of the lens, and K1 is a constant depending on the resist process. It can be appreciated from the aforementioned equation that the resolution can be improved by reducing K1 and $\lambda$, and by increasing NA. In other words, the constant depending on the resist process should be lowered, as well as shortening the wavelength and increasing the NA. However, it is technically difficult to make improvements to the light source and the lens. Also, reduction in the wavelength of light and increase of the NA will cause a more shallow depth of focus of the light, resulting in the problem that the resolution is degraded. To date, various improvements are made to photomasks.

A reduction projection aligner for photolithography employing the reduction exposure method will be described hereinafter. FIG. 15 schematically shows a structure of the optical system of a conventionally used reduction projection aligner. Referring to FIG. 15, the reduction projection aligner includes a light source 10, a focused lens 11 beneath the light source 10 with a predetermined distance therebetween, a photomask 12 having a mask pattern formed therein which is to be written on a wafer, a reduction projection lens 13 for reducing light transmitted from the photomask 12, and a wafer stage 16 on which a wafer 15 to which the pattern is written is mounted. The wafer stage 16 is provided with a motor 14 for moving the wafer 15 to write a pattern on a predetermined position of the wafer 15 mounted on the wafer stage 16. In the reduction projection aligner of the above-described structure, light issued from the light source 10 is directed to a predetermined position on the wafer 15 mounted on the wafer stage 16 via the focused lens 11, the photomask 12, and the reduction projection lens 13, whereby the pattern formed on the photomask 12 is written. The photomask used in the above-described reduction projection aligner will be described in detail with reference to the drawings.

In FIG. 16, (a) shows a sectional view of a conventionally used photomask, (b) shows the amplitude of light right after passing the photomask, (c) shows the amplitude of light in the proximity of the wafer, (d) shows the light intensity on the wafer, and (e) a sectional view of a resist after being patterned using the photomask 20.

Referring to FIG. 16(a), the photomask 20 includes a glass substrate 21, and a mask pattern 22 formed of a metal such as chromium on the glass substrate 21. Light will not pass through the portion of the photomask 20 where the mask pattern 22 is formed. Therefore, the amplitude of the light directly after passing the photomask 20 is substantially 0 in the region corresponding to the mask pattern 22, as shown in FIG. 16(b). In the case where a fine pattern exceeding the aforementioned resolution (R) is to be transferred for the formation of a minute pattern, the light passing through the photomask 20 and the optical system therebeneath is subjected to light diffraction and interference to be enhanced in the overlapping region in adjacent pattern images in the proximity of the wafer, as shown in FIG. 16(c). The difference in intensity of light on the wafer will become smaller, as shown in FIG. 16(d), to result in a lower resolution. Therefore, there was a problem that a desired pattern configuration could not be obtained because sufficient patterning of a resist and the like could not be carried out.

A phase shift exposure method using a phase shift mask is proposed for obtaining a photomask without the above-described problems in, for example, Japanese Patent Laying-Open No. 57-62052 and Japanese Patent Laying-Open No. 58-173744. FIG. 17 shows a photomask using the phase shift mask disclosed in Japanese Patent Laying-Open No. 58-173744, in which (a) shows a sectional view of the photomask, (b) shows the amplitude of the light just passing the photomask, (c) shows the amplitude of the light in the proximity of the wafer after passing through the photomask, (d) shows the intensity of light on the wafer, and (e) shows the configuration of a sectional view of a resist after the resist is patterned using the above photomask.

Referring to FIG. 17(a), a transparent insulating film 23 formed of a silicon oxide film and the like is provided between predetermined mask patterns 22 formed on the surface of a glass substrate 21. The thickness of the transparent insulating film 23 is set so that the light passing through the transparent insulating film is inverted 180° (in this specification, the portion inverting the phase of light by 180° is defined as the "phase shift portion"). Regarding the amplitude of the light right after passing through the photomask, the light passing through the region where the transparent insulating film 23 is formed has its phase inverted 180° with respect to that of the light passing through the portion where the transparent insulating film 23 is not formed, as shown in FIG. 17(b). Because the phases of the light are inverted with respect to each other in the portion where adjacent pattern images overlap, as shown in FIG. 17(c), the light will cancel each other by the interference effect. The difference in light intensity will be sufficient on the wafer to improve the resolution, as shown in FIG. 17(d). Thus, when patterning was carried out of a resist using the above-described phase shift mask, the patterning accuracy was improved, as shown in FIG. 17(e). In the present specification, a photomask including a phase shift portion is defined as a "phase shift mask".

Although such a phase shift mask is very efficient for a regular pattern, it was difficult to apply it to an arbitrary pattern. Thus, a phase shift mask was proposed which is applicable to the formation of an arbitrary pattern. FIG. 18 shows such a phase shift mask disclosed at the IEDM Conference in 1989, in which a sectional view thereof, the light intensity on a wafer where photolithography is carried out using this phase shift mask, and the manufacturing steps thereof, are shown.

Referring to FIG. 18, the phase shift mask includes a glass substrate 21, a mask pattern 22 formed on the glass substrate 21, and a resist film 24 formed on the mask pattern 22. The width of the resist mask 24 is larger than that of the mask pattern 22, in which the difference in the width (edge enhancement width) 25 serves as the phase shift portion. In the phase shift mask of the above-described type, light passing through the proximity of the edge of the mask pattern 22 has its phase inverted by 180°. Light each having an opposite phase will overlap each other beneath the proximity of the edge of the mask pattern 22. Therefore, the light in the proximity of the edge of the pattern image will cancel each other on account of interference to increase the difference in light intensity on the wafer. As a result, a favorable resolution for an arbitrary pattern could be obtained.

However, such a phase shift mask had a problem that will be described hereinafter. The method of manufacturing this phase shift mask will first be described, followed by the problem thereof, with reference to FIGS. 19 and 20.

Referring to FIG. 18(a), a metal film, for example a chromium film 22a, is formed on a transparent glass substrate 1 by a sputtering method. An electron beam (referred to EB hereinafter) resist is applied all over the chromium film 22a to be subjected to thermal treatment, followed by depicting a desired pattern with an EB writing apparatus. Then, developing is carried out to form a resist pattern 24. Using this resist pattern 24 as a mask as shown in FIG. 18(c), the chromium film 22a is etched anisotropically or isotropically to result in a mask pattern 22. Then, using the same resist pattern 24 as a mask, the sidewall of the mask pattern 22 is etched by isotropic etching, for example wet etching. Thus, a mask pattern 22 will be formed that has its edge removed by the edge enhancement width 25.

This phase shift mask had the following problems due to its formation carried out in the above-described manner. The proximity of the edge portion of the resist pattern 24 must be thick enough to invert the phase of the light passing through the resist pattern 24 in order to function as a phase shift portion. However, the resist pattern 24 is used as a mask in the etching step for forming the mask pattern 22, resulting in decrease in thickness. Even if a predetermined film thickness of t was required of the resist pattern 24, only a film thickness of t1 could be obtained due to the film decrease in the etching process, as shown in FIG. 19. There was a possibility that the function of the phase shift portion could not be sufficiently provided. Accurate control of a film thickness to obtain a predetermined film thickness sufficient for a phase shift portion was also not easy.

With the structure of a phase shift mask where the mask pattern 22 is sandwiched, as shown in FIG. 18(d), it was difficult to control precisely the dimension of the edge enhancement width 25. There may be some cases where only a width of W1 of the mask pattern could be obtained with respect to a desired width of W on account of overetching of the sidewall. There was variation in the edge enhancement width 25, resulting in a problem that a transfer of a pattern according to the design could not be carried out. The mask pattern 22 and the resist pattern 24 of the photomask of FIG. 18 had a concaved and convexed configuration, so that contaminants could not be thoroughly removed in the cleaning process of the photomask. Contaminants remaining in the concaved and convexed portion of the photomask resulted in a problem that the pattern formation after the transfer was degraded.

Taking into consideration the foregoing, various improvements of the photomask have been proposed to carry out accurate control of the film thickness and width of the phase shift portion and to reduce the concaved-convexed stepped portion on the substrate. Photomasks disclosed in Japanese Patent Laying-Open Nos. 4-6557, 4-40455, and 4-3412 will be described hereinafter with reference to FIG. 21(a), FIG. 21(b), and FIG. 21(c), respectively.

Referring to FIG. 21(a), the phase shift mask disclosed in Japanese Patent Laying-Open No. 4-6557 has a mask pattern 22 formed on a glass substrate 21. A typical material of the mask pattern 22 includes Cr, MoSi, Si and the like. By subjecting this mask pattern to thermal oxidation, an oxide film 26 is formed to cover the mask pattern 22. The proximity of the periphery of the mask pattern 22 in the oxide film 26 functions as the phase shift portion. It is possible to control the thickness of the phase shift portion more accurately than a conventional one by appropriately adjusting the thermal oxidation condition in the present phase shift mask. Furthermore, the problem of contaminants remaining in the photomask can be avoided effectively because the stepped portion of the substrate and the oxide film 26 is not so complicated.

The phase shift mask of FIG. 21(b) has an opaque mask pattern 22 formed on a glass substrate 21 such as of crystal. Using a CVD method, a transparent film 27 is deposited on the glass substrate 21 and the mask pattern 22. The thickness of the mask pattern 22 and the transparent film 27 is adjusted so that the periphery of the mask pattern 22 is thick enough to function as a phase shift portion. Because a phase shift portion 27a can be formed just by depositing a transparent film, the control of film thickness can be carried out in accuracy in comparison with a conventional one. Also, the stepped portion in the phase shift mask can be reduced.

The phase shift mask of FIG. 21(c) has a film formed of ITO, Ta and the like serving as an etching stopper film 29 provided on a glass substrate 21. A mask pattern 22 is formed on the etching stopper film 29. A sidewall 28 formed of a silicon oxide film, for example, is provided at the sidewall of the mask pattern 22. This sidewall 28 functions as the phase shift portion. The sidewall 28 is formed by providing a silicon oxide film by a CVD method on the mask pattern 22 and the substrate 21, followed by anisotropic etching, referring to FIG. 21(b). By leaving the sidewall 28, it is possible to control the thickness of the phase shift portion by adjusting the thickness of the mask pattern 22. It is therefore possible to control more accurately the film thickness of the sidewall 28 which functions as the phase shift portion, and to reduce the concaved and convexed stepped portion of the photomask.

Thus, the three improved examples of a photomask allowed a more precise control of a film thickness and reduction in the stepped portion, so that the resolution could be improved in comparison with a conventional one.

However, the above-described improved examples had the following problems. In the phase shift mask of the FIG. 21(a), the formation of the oxide film 26 including the phase shift portion was carried out by thermal oxidation. This means that a thermal treatment of high temperature was applied, leading to a possibility of thermal expansion which generates thermal distortion in the mask pattern 22 formed on the substrate 21. If thermal distortion is generated, a mask pattern in conformity with the design could not be obtained, resulting in degradation in the dimension and position accuracy of the pattern. Further more, this phase shift mask had a relatively wide width of the portion functioning as the phase shift portion. Therefore, the width of the portion where light intensity is 0 is increased when the pattern is transferred to the wafer. Therefore, there was a problem that the mask pattern had to be formed taking into consideration the expansion of the portion at the design stage.

In the phase shift mask of FIG. 21(b), the transparent film 27 was formed using a CVD method to result in thermal distortion in the mask pattern 22, as in the above case. Therefore, there was a problem that the dimension and position accuracy of the pattern was degraded. In the phase shift mask of FIG. 21(c), if the silicon oxide film was deposited by a CVD method prior to the formation of the sidewall 28, thermal distortion was generated in the mask pattern 22, as in the above cases. Furthermore, this phase shift mask had an etching stopper film 29 formed on the substrate 21. Therefore, light transmittance is reduced by approximately 80% in comparison with the case where there is no etching stopper film 29, resulting in the problem of reduction in the intensity of the transmitted light. The etching stopper film 29 also had a problem that it has low tolerance to chemicals. More specifically, it was easily damaged by solutions such as alkaline based types in the cleaning process. There was a possibility of the etching stopper film 29 being removed after the cleaning step where the etching stopper film 29 is exposed. In this case, a portion of the etching stopper film 29 will remain beneath the sidewall 28 to modify the film thickness of the sidewall 28. More specifically, the film thickness of the phase shift portion may be changed.

SUMMARY OF THE INVENTION

An object of the present invention is to provide a photomask that can prevent degradation of pattern accuracy caused by thermal distortion of a mask pattern, and the method of manufacturing thereof.

Another object of the present invention is to provide a photomask having a phase shift portion in which the film thickness thereof is easily controlled and which has a width within a range that does not affect the pattern accuracy after exposure, and a method of manufacturing thereof.

A further object of the present invention is to provide a photomask with a reduced concaved and convexed stepped portion which is easy to manufacture and allows patterning in conformity with the design.

In order to achieve the above objects, a photomask according to an aspect of the present invention includes a transparent substrate, having adjacent first and second regions a light shielding film for preventing light from passing therethrough formed on the formed on the first region of said transparent second region of the substrate and constituted by a bottom in contact with the substrate, a side face at an acute angle with respect to the bottom, and an upper face in parallel with the bottom and at an obtuse angle with respect to the side face and a transparent film formed on the light shielding film and the substrate.

The transparent film is formed in a gently-sloping configuration on the side face of the light shielding film because the side face of the light shielding film is inclined at a predetermined angle. It is therefore possible to form easily the portion having a predetermined film thickness that can function as the phase shift portion in the periphery of the light shielding film at a predetermined width. The film thickness of the phase shift portion can be easily controlled because only a portion of the gently-sloping phase shift portion must be set to a desired film thickness.

According to another aspect of the present invention, a photomask includes a transparent substrate, a first film of low reflectance formed on the substrate, and a second film formed on the first film and having light shielding feature.

The reflectance of the reflecting light entered into the photomask can be significantly reduced. As a result, inferior effect to the pattern resolution due to the reflecting light can be reduced significantly.

Preferably, a third film of low reflectance is formed on the second film. The second film preferably includes a bottom in contact with the upper face of the first film, a side face at an acute angle to the bottom and substantially coplanar with the side face of the first film, and an upper face at an obtuse angle to the side face, with a transparent film formed on the third film and the substrate.

When the film of low reflectance is formed also on the second film, the reflecting light entering the photomask from above and below can have its reflectance reduced significantly. Furthermore, when the second film is sandwiched by the first and third films of low reflectance and has a sloped side face, a transparent film having a phase shift portion of a predetermined width can easily be formed in the proximity of the periphery of the second film, and the reflectance of the reflecting light entering the photomask can be reduced. Thus, the resolution can further be improved.

According to a method of manufacturing a photomask of the present invention, a light shielding film is patterned on a transparent substrate in a trapezoid configuration having an upper base shorter than the lower base. Then a transparent film is formed on this light shielding film and the substrate at a temperature not more than 250° C. Because the transparent film is formed at a low temperature of not more than 250° C., there is hardly no influence upon the configuration of the light shielding film in forming the transparent film. Thus, the offset of the mask pattern dimension from the design value can be reduced significantly.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16(a) is a sectional view of a conventional photomask, FIGS. 16(b)–(d) are diagrams for describing the transmitting light, and FIG. 16(e) is a sectional view of a resist where patterning is carried out using a conventional photomask.

FIG. 17(a) is a sectional view of a conventional phase shift mask, FIGS. 17(b)–(d) are diagrams for describing transmitting light, and FIG. 17(e) is a sectional view of a resist where patterning is carried out using the conventional phase shift mask.

DESCRIPTION OF THE PREFERRED EMBODIMENTS

Figure 1:
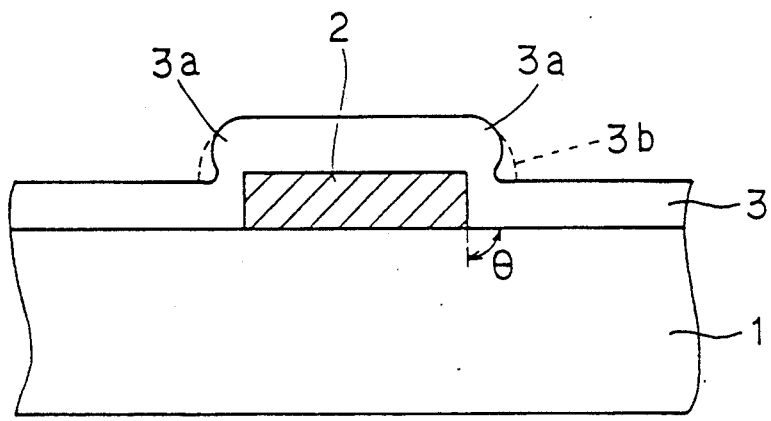
FIG. 1 is a sectional view of a phase shift mask according to an embodiment of the present invention.
Figure 2:
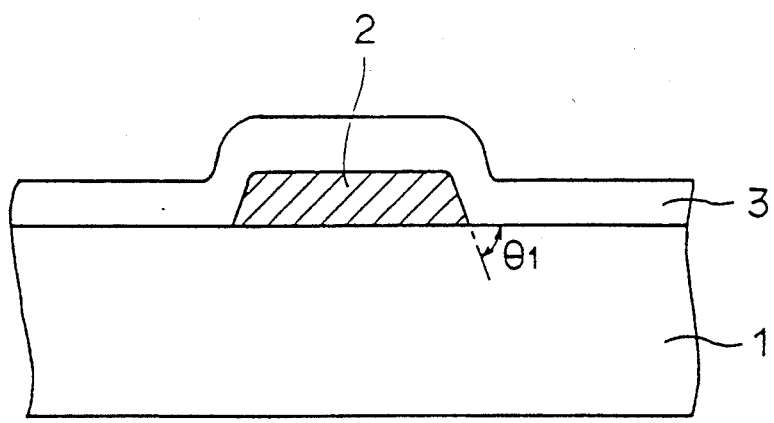
FIG. 2 is a sectional view of a phase shift mask according to another embodiment of the present invention.
Figure 3:
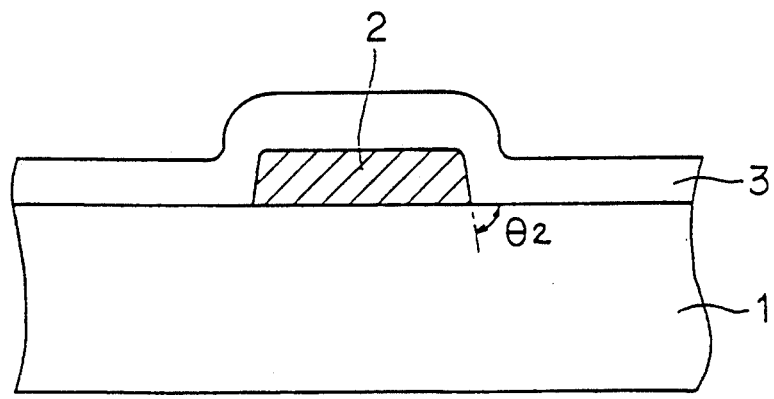
FIG. 3 is a sectional view of a phase shift mask according to a further embodiment of the present invention.

The embodiments of the photomask according to the present invention will be described hereinafter with reference to FIGS. 1–14. FIG. 1 is a sectional view of a photomask (referred to as "phase shift mask" hereinafter) in which the angle $\theta$ between the side face and the bottom of the light shielding film 2 is 90°. FIG. 2 is a sectional view of a phase shift mask in which the angle $\theta 1$ between the side face and the bottom of the light shielding film 2 is approximately 70 degrees. FIG. 3 is a sectional view of a phase shift mask in which the angle $\theta 2$ between the side face and the bottom in the light shielding film 2 is approximately 85°. Referring to FIG. 1, a light shielding film 2 in which the angle of the side face to the bottom face $\theta$ is approximately 90° is formed on a substrate 1 of a glass and the like. On the substrate 1 and the light shielding film 2, a transparent film 3 such as of a silicon oxide film or alumina is formed. The transparent film 3 is formed at a temperature not more than 250° C. by a sputtering method. Because the transparent film 3 is formed at a low temperature not more than 250° C., the phenomenon of thermal distortion caused by thermal expansion of the light shielding film 2 can be avoided in the formation of the transparent film 3. In the case the transparent film 3 is formed by a sputtering method or a vacuum evaporation method, a narrow portion 3a is formed in the transparent film 3 in the proximity of the periphery of the light shielding film 2. It can be said that the $\theta$ value of 90° is not preferred because there may be a case where a phase shift portion of a desired film thickness is not formed in the periphery of the light shielding film 2 due to the narrow portion 3a. However, when the silicon oxide film is formed using an ECR plasma CVD method at a low temperature of not more than 250° C., a narrow portion indicated by the broken line of 3b in FIG. 1 will not be generated, so that the transparent film 3 can be formed using this method.

As described above, a narrow portion 3a was formed in the transparent film 3 when the method of sputtering or vacuum evaporation was employed. In order to avoid the generation of this narrow portion 3a, the angle $\theta 1$ between the side face and the bottom of the light shielding film 2 is set to a value smaller than 90°, for example 70°, as shown in FIG. 2. This allows the generation of a narrow portion 3a formed in the proximity of the periphery of the light shielding film 2 in the transparent film 3 to be prevented effectively. Thus, a transparent film 3 of a smooth configuration can be formed in the periphery of the light shielding film 2 so that a thickness sufficient for the function of a phase shift portion can be obtained easily. Because the width of the portion which functions as the phase shift portion may become very small if the angle $\theta 1$ between the side face and the bottom of the light shielding film 2 becomes less than 70°, a preferable value of $\theta 1$ is not less than 70°.

FIG. 3 shows the case where the angle between the side face and the bottom of the light shielding film 2 is 85°. The generation of a narrow portion in the transparent film 3 is mitigated in comparison with the case where the angle between the side face and the bottom of the light shielding film 2 is 90°. It is therefore possible to obtain a phase shift portion in a more reliable manner. Thus, the preferable range of the angle between the side face and the bottom of the light shielding film 2 is 70°–85° in the case of forming a transparent film 3 at a low temperature using the vacuum evaporation method or the sputtering method. It is therefore possible to form a phase shift portion in a more reliable and easy manner.

Figure 13:
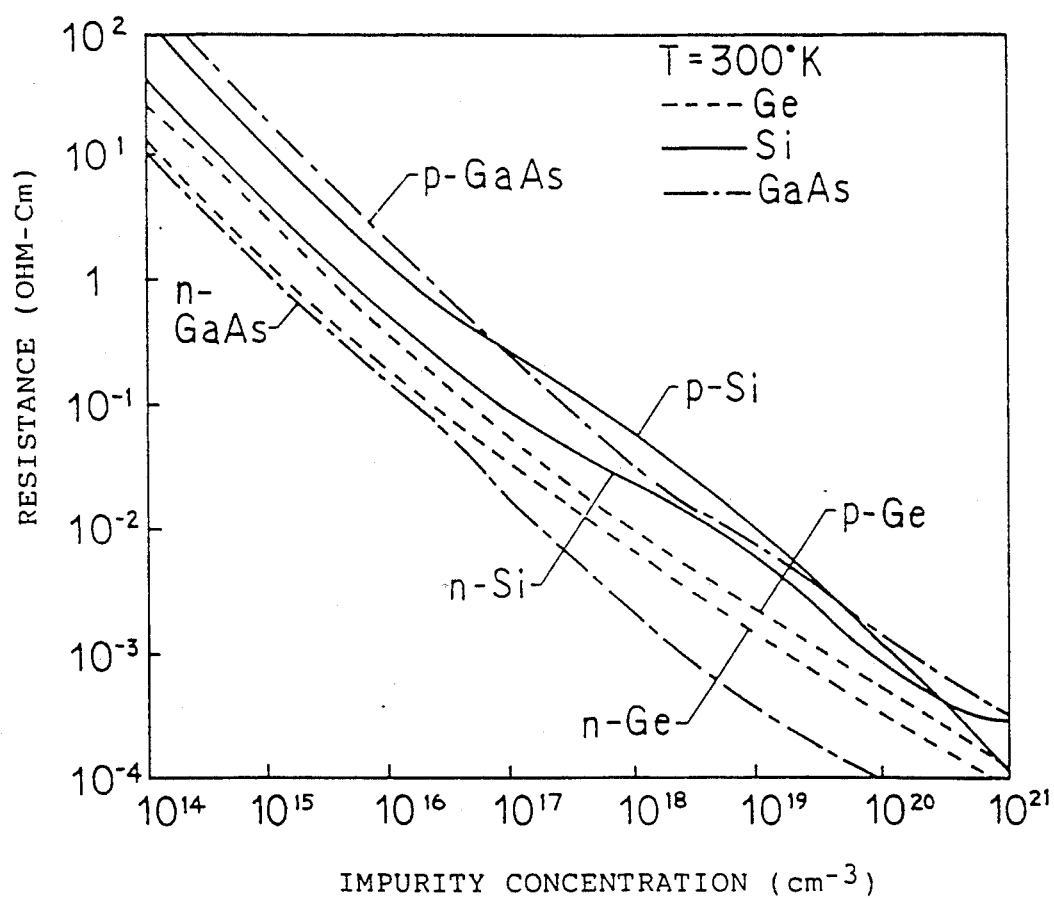
FIG. 13 is a graphic representation showing the resistivity (OHM−Cm) vs. impurity concentration (cm$^{-3}$) for Ge, Si, and GaAs at 300° K.

In the above-described phase shift mask, the material of the light shielding film 2 may include Cr, W, Mo, refractory metal silicide, Si, impurity-introduced Si, metal-introduced Si to increase opacity, or the like. If Si is used as the material of the light shielding film 2, charge is easily stored to cause charge-up in writing a pattern with an EB due to a pure Si having a high electrical resistance. Therefore, there may be an offset in the pattern, so that a mask pattern of high accuracy cannot be obtained. The resistance of the Si can be reduced by introducing impurities such as phosphorus (P) or boron (B) into Si. FIG. 13 is a graph showing the resistivity (OHM−Cm) vs. impurity concentration (cm$^{-3}$) for Si, Ge and GaAs at 300° K. When silicon having impurities introduced is used as the light shielding film 2, the impurities are introduced at the same time Si is formed by a CVD method or sputtering method.

Figure 14:
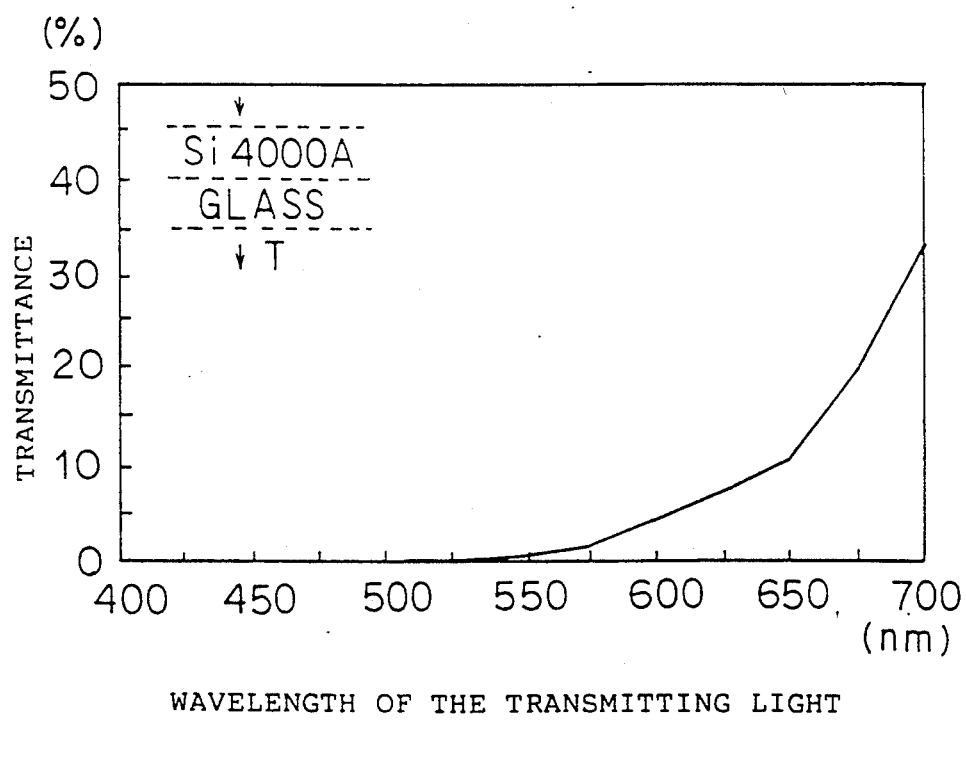
FIG. 14 is a graphic representation showing the relationship between the transmittance (%) and the wavelength (nm) of the light passing through Si.
Figure 15:
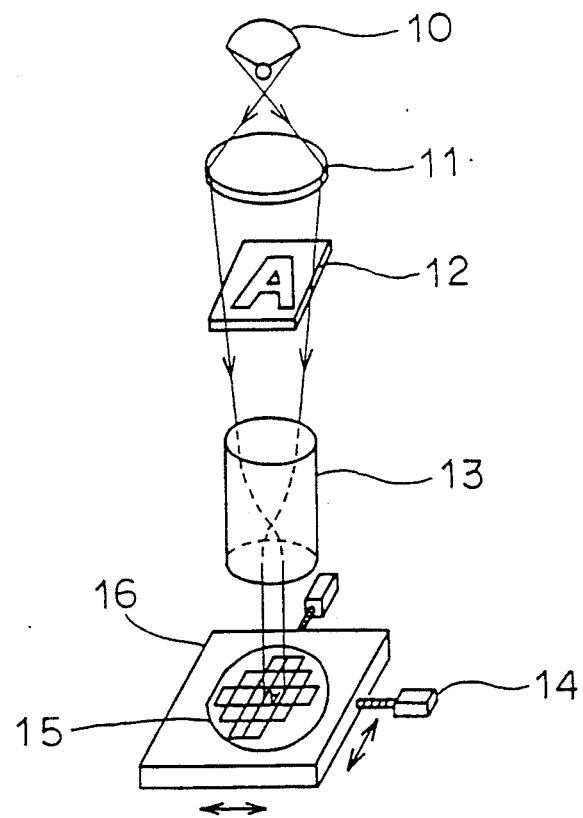
FIG. 15 schematically shows a structure of an optical system of a conventional reduction projection aligner.
Figure 18:
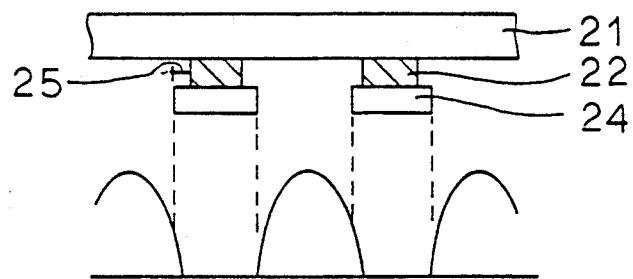
FIG. 18 is a sectional view of another conventional phase shift mask with the manufacturing steps thereof shown in FIGS. 18(a)–(d).
Figure 18A:
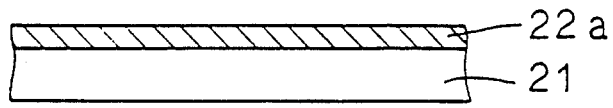
Figure 18B:
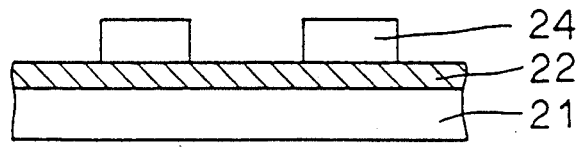
Figure 18C:
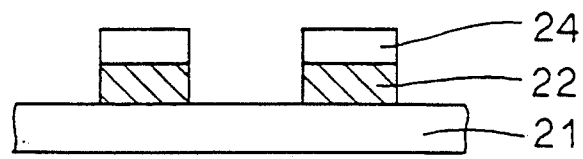
Figure 18D:
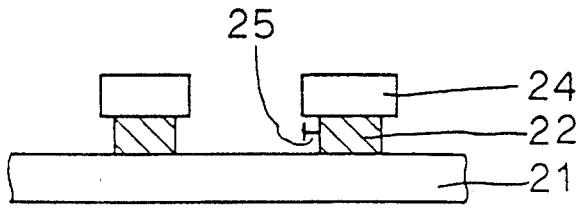
Figure 19:
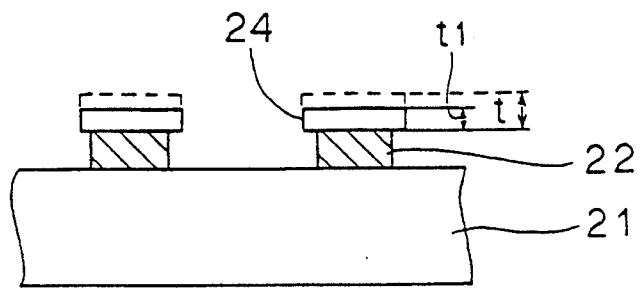
FIG. 19 is a diagram for describing the problem of the conventional phase shift mask of FIG. 18.
Figure 20:
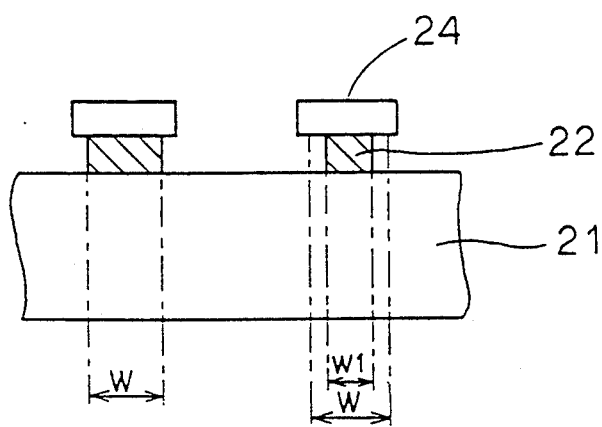
FIG. 20 is a diagram for describing other problems of the conventional phase shift mask of FIG. 18.
Figure 21A:
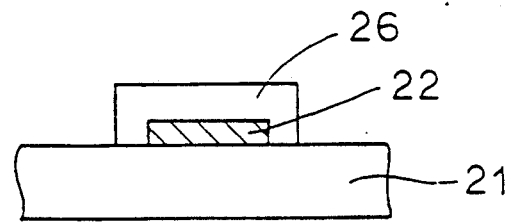
FIGS. 21(a)–(c) are sectional views of phase shift masks which include improvements of the phase shift mask of FIG. 18.
Figure 21B:
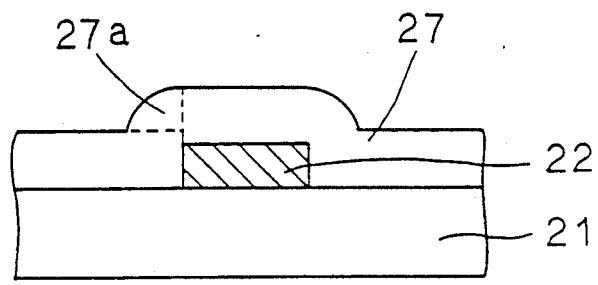
Figure 21C:
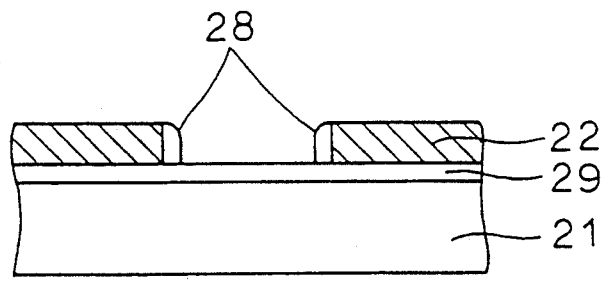

The transmittance of light in Si depends upon the wavelength of light. FIG. 14 shows the wavelength dependency of the light transmittance of Si in which transmittance (%) is plotted along the ordinate and the wavelength (mn) of the transmitting light plotted along the abscissa. It can be appreciated from FIG. 14 that Si has a tendency to transmit light when the wavelength of the transmitting light is more than 500 nm. In the current inspection process of the mask pattern of a photomask, light of a mercury-vapor lamp is used. Because the wavelength of mercury light is more than 500 nm, inspection of high accuracy is difficult to carry out in the inspection process when Si is used as the light shielding film 2. Therefore, metal such as Ge, Ta, and Mo is mixed into the Si to increase opacity with respect to light, so that inspection of high accuracy can be carried out in the inspection process when Si is used as the light shielding film.

Figure 8:
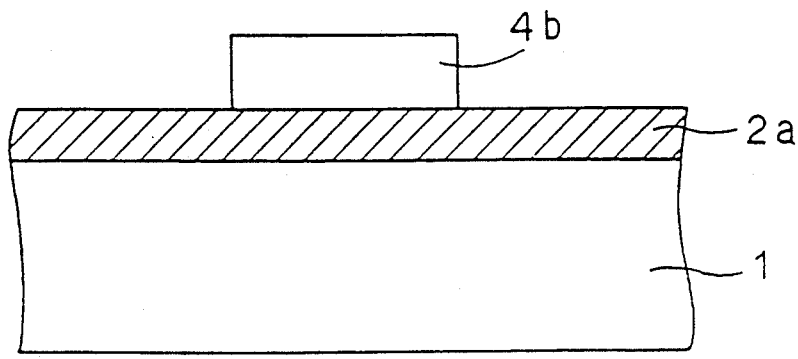
FIGS. 8–10 are sectional views of the phase shift mask of FIG. 2 showing the first–third manufacturing steps thereof according to another manufacturing method.
Figure 9:
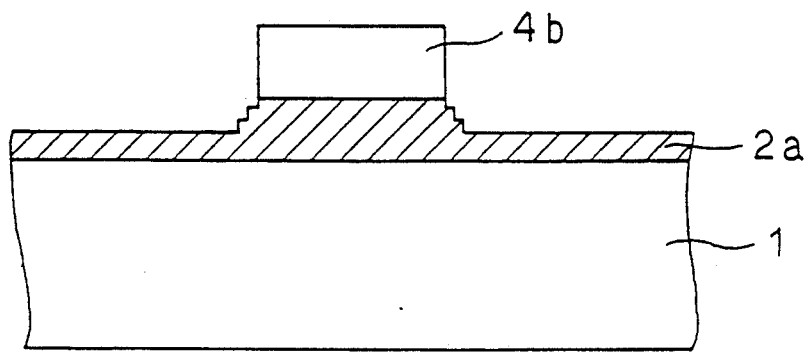
Figure 10:
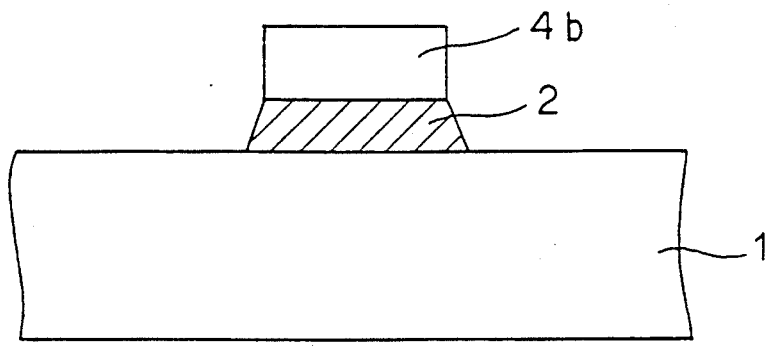

A method of manufacturing the phase shift mask of the above-described structure will be described hereinafter with reference to FIGS. 4–10. FIGS. 4–7 are sectional views of the phase shift mask having the above-described structure showing the first–fourth manufacturing steps thereof according to a manufacturing method. FIGS. 8–10 are sectional views of the phase shift mask having the above-described structure showing first–third manufacturing steps according to another manufacturing method.

Figure 4:
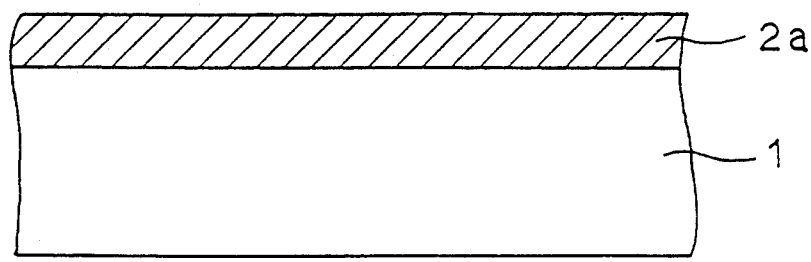
FIGS. 4–7 are sectional views of the phase shift mask of FIG. 2 showing the first–fourth manufacturing steps thereof according to a manufacturing method.
Figure 5:
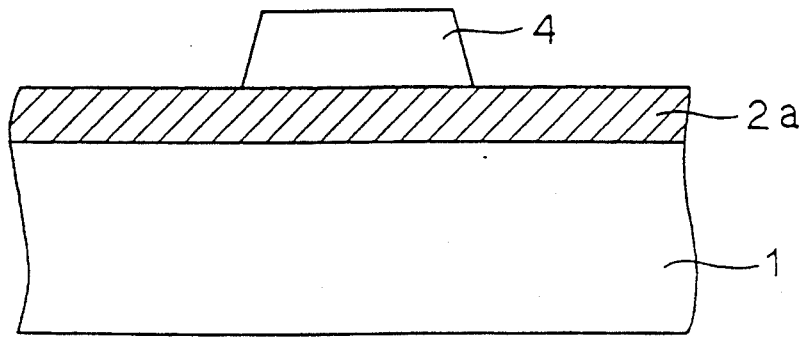

Referring to FIG. 4, a chromium film 2a which becomes the light shielding film 2 is deposited on the substrate 1 by sputtering or the like. The chromium film 2a is set to a film thickness that allows the transparent film 3 to be formed in a later process to an appropriate thickness required for the transparent film 3 to function as the phase shift portion in the periphery of the chromium film 2a. The required film thickness d(nm) of a phase shift portion is typically expressed as $d = \lambda/(2 \cdot (n-1))$, where $\lambda$ is the wavelength (nm) of light, and n the refractive index of the transparent film. In the case an i-line is used as the exposure light and a silicon oxide film as the transparent film, $\lambda = 365$ nm and $n = 1.42$, resulting in d = 434.5 nm. Therefore, the film thickness of the chromium film 2a is preferable approximately 434.5 nm.

Then, an EB resist is applied to a thickness of approximately 500 nm–700 nm all over the surface of the chromium film 2a to be subjected to thermal treatment. Using an EB writing apparatus, a desired pattern is written, followed by a developing process to result in the formation of a resist pattern 4. As shown in FIG. 4, the configuration of the resist pattern 4 is patterned according to the configuration of the light shielding film 2, which is a trapezoid in this case.

Figure 6:
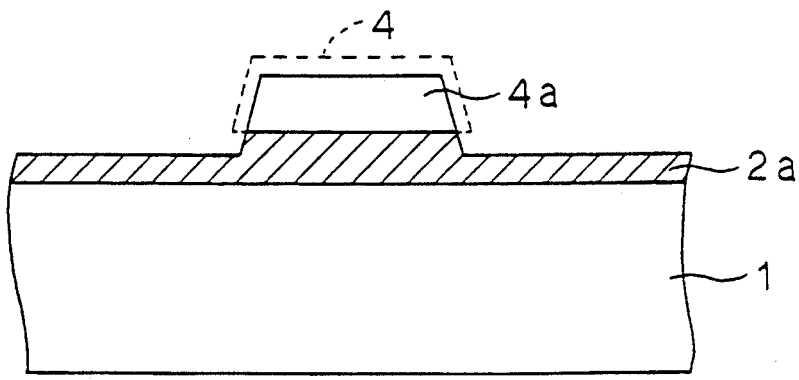
Figure 7:
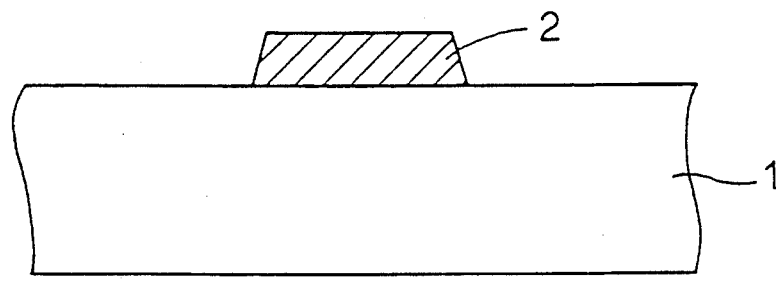

Then, etching is carried out using the resist pattern 4 as a mask, whereby a light shielding film 2 of a trapezoid configuration is formed, as shown in FIGS. 6 and 7.

Another manufacturing method of the above-described phase shift mask will be described hereinafter with reference to FIGS. 8–10. Referring to FIG. 8, a step similar to the above step is carried out to form a chromium film 2a of a predetermined thickness on the substrate 1. Then, a resist pattern 4b is formed thereon. In this case, it is not required to form resist pattern 4b in a trapezoid configuration as in the above resist pattern 4. Then, using the resist pattern 4b as a mask, taper etching is carried out to incline the side face of the light shielding film 2, as shown in FIGS. 9 and 10. A typical etching method is to gradually leave an etching product on the sidewall of the light shielding film 2, as shown in FIG. 9, by adjusting appropriately etching conditions such as the etching gas. Although the sidewall of the light shielding film 2 is shown in a stepped portion configuration in FIG. 9 to indicate the manner of the gradual etching progress, the sidewall of the light shielding film 2 actually has a smooth sloped configuration, as shown in FIG. 10.

After the formation of a trapezoid-shaped light shielding film 2, a transparent film such as of a silicon oxide film is formed at a temperature not more than 250° C. using the vacuum evaporation method, the sputtering method, or the ECR plasma CVD method. By controlling appropriately the film thickness of the light shielding film 2, a transparent film 3 having a phase shift portion of a desired width is formed in the proximity of the periphery of the light shielding film 2.

Figure 11:
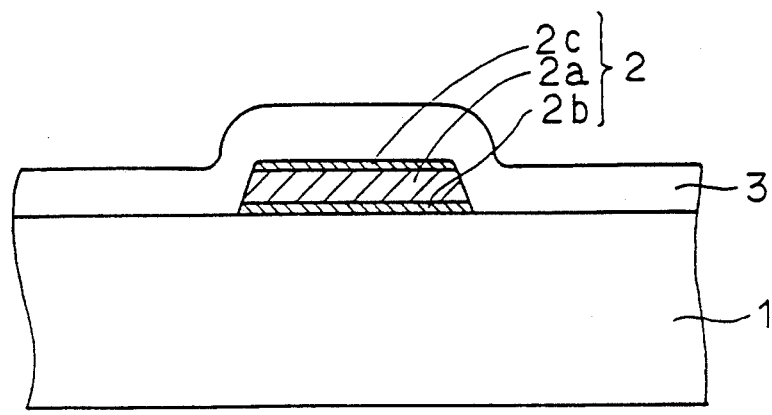
FIG. 11 is a sectional view of a phase shift mask according to still another embodiment of the present invention.
Figure 12:
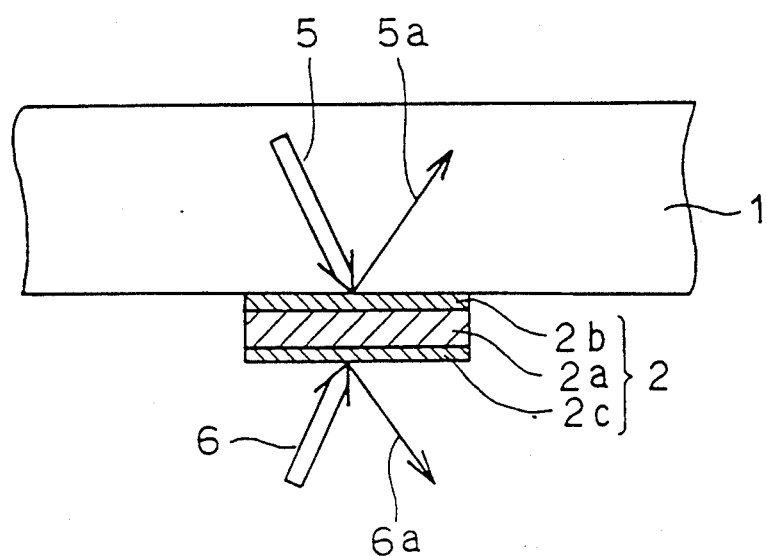
FIG. 12 is a diagram for describing the function of the phase shift mask of FIG. 11.

Another embodiment of a phase shift mask according to the present invention will be described with reference to FIGS. 11 and 12. FIG. 11 is a sectional view of a phase shift mask according to another embodiment of the present invention. Referring to FIG. 11, the light shielding film 2 includes a chromium film 2a, and chromium oxide films 2c and 2b formed above and beneath the chromium film 2a. The low reflectance of the chromium oxide films 2b and 2c contribute to improve the patterning accuracy.

It is preferable that the film thickness of the chromium oxide films 2b and 2c is approximately 20 nm–30 nm taking into consideration its feature of low reflectance. The film thickness of the chromium film 2a is approximately 100 nm–340 nm. The patterning accuracy can be further improved in the present embodiment because the light shielding film 2 has films 2b and 2c of low reflectance in the upper and lower portion thereof, as well as a trapezoid configuration. The material of the light shielding film 2 includes metal or silicide. The film of low reflectance formed in the upper and lower portions of the light shielding film 2 may be a metal oxide film, a metal nitride film, or a metal oxynitride.

The effect of comprising a three-layered light shielding film 2 will be described in detail with reference to FIG. 12. As described in the conventional embodiment, optical systems such as a focused lens and a reduction projection lens are provided below and above the phase shift mask. Accordingly, reflecting light 5 from the upward direction and reflecting light 6 from a wafer disposed below the phase shift mask impinge onto the light shielding film 2 in the phase shift mask. The impinged reflecting light 5 and 6 are absorbed to some level by films 2b and 2c of low reflectance, respectively, and then further reflected to result in reflecting light 5a and 6a, respectively. The films 2b and 2c of low reflectance in the light shielding film 2 will significantly reduce the reflectance of the respective reflecting light 5 and 6. The reflectance of approximately 50% in the case where films 2b and 2c of low reflectance are not provided can be reduced to a reflectance of approximately 11% by providing films 2b and 2c of low reflectance. This means that the influence of the reflecting light can be reduced significantly with respect to light from the light source which enters the phase shifting mask. This will contribute to improvement in patterning accuracy.

According to the present invention, a transparent film including a phase shift portion is formed on the light shielding film and the substrate 1 at a relatively low temperature. Because this transparent film can be formed in an atmosphere of low temperature, the phenomenon of thermal expansion in the light shielding film can be avoided. The resolution of the pattern can be made to further approximate the design value in comparison with the case where the transparent film is formed under an atmosphere of high temperature. It is also possible to form a phase shift portion having a gentle slope in the proximity of the periphery of the light shielding film by inclining the side face of the light shielding film. It will become easier to obtain a phase shift portion of a desired width. This also contributes to improve the resolution to obtain a pattern closer to that of the design value. Furthermore, the manufacturing process is facilitated because only a transparent film is required to be deposited on a light shielding film and the substrate. The film thickness of the phase shift portion can be easily controlled. The phenomenon of residue of contaminants even after the cleaning process can be avoided because the stepped portion of the phase shift mask is smooth and not complicated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask comprising:
   a transparent substrate having adjacent first and second regions,
   a light shielding film formed on said first region on said substrate for preventing light from passing therethrough, including a bottom in contact with said substrate, a side face at an acute angle to said bottom, and an upper face in parallel with said bottom and at an obtuse angle to said side face, and
   a transparent film formed on said substrate so as to cover said light shielding film and said second region.

2. The photomask structure according to claim 1, wherein the angle between said bottom and said side face is 70°-85°.

3. The photomask structure according to claim 1, wherein said light shielding film comprises silicon having impurities introduced therein.

4. The photomask structure according to claim 1, wherein said light shielding film comprises silicon having metal introduced therein for reducing the transparency of the light shielding film.

5. The photomask structure according to claim 1, wherein said transparent film comprises a film formed by sputtering.

6. The photomask structure according to claim 1, wherein said transparent film comprises a film formed by vacuum evaporation.

7. The photomask structure according to claim 1, wherein said transparent film comprises a film formed using an ECR plasma CVD method.

8. A photomask comprising:
   a transparent substrate having adjacent first and second regions, at a main surface,
   a first film of low reflectance selectively formed at said first region on said substrate, and
   a second film and formed on said first film and having light shielding function.

9. The photomask structure according to claim 8, wherein a third film of low reflectance is formed on said second film.

10. The photomask structure according to claim 8, wherein said second film comprises a bottom in contact with said first film, a side face at an acute angle to said bottom, and an upper face at an obtuse angle to said side face and in parallel with said bottom.

11. The photomask structure according to claim 8, wherein
    said second film comprises a bottom in contact with said first film, a side face at an acute angle to said bottom, and an upper face at an obtuse angle to said side face and in parallel with said bottom,
    a transparent film is formed on said first film and said substrate.

12. The photomask structure according to claim 8, wherein
    the material of said second film comprises metal or silicide, and
    the material of said first film comprises an oxide film, a nitride film, or an oxynitride film of said second film.

13. The photomask structure according to claim 9, wherein
    said second film comprises a bottom in contact with said first film, a side face at an acute angle to said bottom, and an upper face at an obtuse angle to said side face and in parallel with said bottom,
    a transparent film is formed on said third film and said substrate.

14. A method of manufacturing a photomask comprising the steps of:
    patterning a light shielding film in a trapezoid configuration in which the upper base is shorter than the lower base on a transparent substrate, and
    forming a transparent film at a temperature of not more than 250° C. on said substrate and said light shielding film.

15. The method of manufacturing a photomask according to claim 14, wherein said transparent film is formed by a sputtering method.

16. The method of manufacturing a photomask according to claim 14, wherein said transparent film is formed by a vacuum evaporation method.

17. The method of manufacturing a photomask according to claim 14, wherein said transparent film is formed by an ECR plasma CVD method.

18. The method of manufacturing a photomask according to claim 14, wherein said step of patterning said light shielding film comprises the steps of
    forming a resist of a trapezoid configuration having an upper base shorter than the lower base on said light shielding film, and
    patterning said light shielding film with said resist as a mask.

19. The method of manufacturing a photomask according to claim 14, wherein said light shielding film is patterned by taper etching.

* * * * *